(12) United States Patent  (10) Patent No.: US 9,275,725 B2
Stepanov  (45) Date of Patent: Mar. 1, 2016

(54) MEMORY DEVICE AND METHOD OF OPERATING THE SAME

(71) Applicant: Samsung Electronics Co., Ltd., Suwon-si (KR)

(72) Inventor: Alexander Stepanov, Ashdod (IL)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 14/195,049

(22) Filed: Mar. 3, 2014

(65) Prior Publication Data

US 2014/0328114 A1 Nov. 6, 2014

(30) Foreign Application Priority Data

May 3, 2013 (KR) ........................ 10-2013-0050119

(51) Int. Cl.
*G11C 11/419* (2006.01)
*G11C 27/02* (2006.01)
*G11C 11/412* (2006.01)

(52) U.S. Cl.
CPC ............ *G11C 11/419* (2013.01); *G11C 11/412* (2013.01); *G11C 27/02* (2013.01); *G11C 27/024* (2013.01)

(58) Field of Classification Search
CPC .... G11C 11/419; G11C 11/412; G11C 27/02; G11C 27/024
USPC .................... 365/154, 149, 190, 210.12, 205; 327/91, 51, 57, 540, 409, 410
See application file for complete search history.

(56) References Cited

U.S. PATENT DOCUMENTS

| | | | | |
|---|---|---|---|---|
| 4,010,453 A * | 3/1977 | Lewis | ................ | G11C 11/4091 327/52 |
| 4,321,492 A * | 3/1982 | Hollingsworth | ....... | H03K 5/023 327/546 |
| 5,375,089 A * | 12/1994 | Lo | ............................ | G11C 8/16 365/189.03 |
| 5,701,268 A * | 12/1997 | Lee | ..................... | G11C 11/4091 365/190 |
| 5,831,897 A * | 11/1998 | Hodges | ................ | G11C 11/412 257/350 |
| 5,994,950 A * | 11/1999 | Ochi | ....................... | G05F 1/468 327/538 |
| 6,337,824 B1 * | 1/2002 | Kono | .................. | G11C 11/406 257/E21.097 |
| 6,421,289 B1 * | 7/2002 | Lu | .......................... | G11C 7/065 365/205 |
| 6,510,076 B1 * | 1/2003 | Lapadat | ............. | G11C 11/4125 365/154 |
| 6,803,794 B2 * | 10/2004 | Martin | ............... | G01R 27/2605 327/52 |
| 6,819,612 B1 * | 11/2004 | Achter | .................... | G11C 7/065 365/189.11 |
| 6,912,167 B2 * | 6/2005 | Tam | ....................... | G11C 11/22 365/189.09 |
| 7,102,915 B2 | 9/2006 | Sohn | | |
| 7,460,387 B2 * | 12/2008 | Matick | ............... | G11C 11/4091 365/149 |
| 7,525,868 B2 | 4/2009 | Liaw | | |
| 7,643,330 B1 | 1/2010 | Lin et al. | | |

(Continued)

FOREIGN PATENT DOCUMENTS

| | | |
|---|---|---|
| JP | 10335489 | 12/1998 |
| JP | 11186410 | 7/1999 |
| KR | 1020020082666 | 10/2002 |

*Primary Examiner* — Vu Le
*Assistant Examiner* — Sung Cho
(74) *Attorney, Agent, or Firm* — Onello & Mello LLP

(57) ABSTRACT

A memory device includes a memory cell, a sensing circuit connected to sense data stored in a memory cell and to connect the memory cell by first and second paths separate from one another A sample and hold circuit connected between the memory cell and the sensing circuit may separate a period during which voltages of the first and second paths are developed by the data stored in the memory cell from a period during which the sensing circuit senses the data stored in the memory cell by detecting the developed voltages of the first and second paths.

17 Claims, 15 Drawing Sheets

(56) References Cited

U.S. PATENT DOCUMENTS

| | | | |
|---|---|---|---|
| 7,738,282 B2 | 6/2010 | Liaw | |
| 7,859,921 B2 | 12/2010 | Arsovski et al. | |
| 7,940,599 B2 | 5/2011 | Lu et al. | |
| 8,189,368 B2 | 5/2012 | Liaw | |
| 2002/0027810 A1* | 3/2002 | Iida | G11C 7/10 365/189.11 |
| 2002/0136051 A1* | 9/2002 | Hardee | G11C 7/1051 365/149 |
| 2003/0193824 A1* | 10/2003 | Tsukikawa | G11C 11/406 365/149 |
| 2004/0202039 A1* | 10/2004 | Takayanagi | G11C 5/02 365/233.1 |
| 2005/0041517 A1* | 2/2005 | Smith | G11C 11/15 365/232 |
| 2006/0044907 A1* | 3/2006 | Forbes | G11C 7/062 365/207 |
| 2010/0045249 A1* | 2/2010 | Park | G05F 1/563 323/282 |
| 2010/0301949 A1* | 12/2010 | Hayashi | G11C 5/145 330/296 |
| 2011/0037708 A1* | 2/2011 | Yang | G06F 3/044 345/173 |
| 2011/0103137 A1* | 5/2011 | Beat | G11C 11/412 365/156 |
| 2011/0317477 A1 | 12/2011 | Liaw | |

* cited by examiner

MEMORY DEVICE AND METHOD OF OPERATING THE SAME

CROSS-REFERENCE TO RELATED APPLICATION

This application claims priority from Korean Patent Application No. 10-2013-0050119 filed on May 3, 2013 in the Korean Intellectual Property Office, and all the benefits accruing therefrom under 35 U.S.C. 119, the contents of which in its entirety are herein incorporated by reference.

BACKGROUND

1. Field of the Invention

Exemplary embodiments in accordance with principles of inventive concepts relate to a memory device and a method of operating the same.

2. Description of the Related Art

Semiconductor memory devices are memory devices implemented using a semiconductor such as Si, Ge, GaAs, or InP. Semiconductor memory devices are broadly classified into volatile memory devices and nonvolatile memory devices.

Volatile memory devices lose stored data when their power supply is interrupted. Examples of the volatile memory devices include static random access memories (SRAMs), dynamic random access memories (DRAMs), and synchronous dynamic random access memories (SDRAMs).

Nonvolatile memory devices retain stored date even when the power supply is interrupted. Examples of the nonvolatile memory devices include read-only memories (ROMs), programmable read-only memories (PROMs), erasable programmable read-only memories (EPROMs), electrically erasable programmable read-only memories (EEPROMs), flash memories, and resistive memories (e.g., phase-change random access memories (PRAMs), ferroelectric random access memories (FRAMs), and resistive random access memories (RRAMs)).

SUMMARY

In exemplary embodiments in accordance with principles of inventive concepts a memory device includes a memory cell; a sensing circuit connected to the memory cell to sense data stored in the memory cell by first and second paths which are separated from each other; and a sample and hold circuit connected between the memory cell and the sensing circuit to separate a period during which voltages of the first and second paths are developed by the data stored in the memory cell from a period during which the sensing circuit senses the data stored in the memory cell by detecting the developed voltages of the first and second paths.

In exemplary embodiments in accordance with principles of inventive concepts a memory cell comprises a push-pull circuit to develop either of the first and second paths to a first voltage according to the data stored in the memory cell and to develop the other one of the first and second paths to a second voltage which is different from the first voltage.

In exemplary embodiments in accordance with principles of inventive concepts the first voltage is a supply voltage supplied to the memory device, and the second voltage comprises a ground voltage.

In exemplary embodiments in accordance with principles of inventive concepts a memory device includes a voltage regulator to regulate a third voltage provided to the memory device to the first voltage which is lower than the third voltage and to provide the first voltage to the push-pull circuit, wherein the second voltage comprises the ground voltage.

In exemplary embodiments in accordance with principles of inventive concepts a memory device includes at least one inverter and at least one pass transistor which is gated by a word line signal to provide the first voltage or the second voltage to the push-pull circuit.

In exemplary embodiments in accordance with principles of inventive concepts a memory cell includes at least one inverter and at least one NOR gate which is gated by a word line signal to control the push-pull circuit.

In exemplary embodiments in accordance with principles of inventive concepts a memory device includes a static random access memory (SRAM) cell.

In exemplary embodiments in accordance with principles of inventive concepts a sample and hold circuit includes a first switch gated by a sampling signal to charge a first capacitor with the voltage of the first path; and a second switch gated by the sampling signal to charge a second capacitor with the voltage of the second path.

In exemplary embodiments in accordance with principles of inventive concepts a memory device includes a sensing circuit configured to sense the data stored in the memory cell based on a difference between the voltage charged in the first capacitor and the voltage charged in the second capacitor.

In exemplary embodiments in accordance with principles of inventive concepts a method of operating a memory device includes developing voltages of first and second paths according to data stored in a first memory cell; sensing the data stored in the first memory cell by detecting the developed voltages of the first and second paths; and developing the voltages of the first and second paths according to data stored in a second memory cell, which is different from the first memory cell, in a state where the first and second paths are not pre-charged.

In exemplary embodiments in accordance with principles of inventive concepts sensing of the data stored in the first memory cell and the developing of the voltages of the first and second paths according to the data stored in the second memory cell are performed together while a level of a read clock is a first level, and the developing of the voltages of the first and second paths according to the data stored in the second memory cell is performed while the level of the read clock is a second level which is different from the first level.

In exemplary embodiments in accordance with principles of inventive concepts a method includes if the data stored in the first memory cell is identical to the data stored in the second memory cell, the voltages of the first and second paths remain substantially unchanged.

In exemplary embodiments in accordance with principles of inventive concepts a method includes the developed voltages of the first and second paths are smaller than a first voltage, and the first voltage is smaller than a second voltage provided to the memory device.

In exemplary embodiments in accordance with principles of inventive concepts the sensing of the data stored in the first memory cell by detecting the developed voltages of the first and second paths comprises: charging first and second capacitors with the developed voltages of the first and second paths, respectively; and sensing the data stored in the first memory cell based on a difference between the voltage charged in the first capacitor and the voltage charged in the second capacitor.

In exemplary embodiments in accordance with principles of inventive concepts each of the first and second memory cells comprises an SRAM cell.

In exemplary embodiments in accordance with principles of inventive concepts an electronic device includes a memory cell including a push pull circuit; a sensing circuit connected to the memory cell to sense data stored in the memory cell by first and second paths which are separated from each other; and a sample and hold circuit connected between the memory cell and the sensing circuit to sample data stored in the memory cell and to provide the sampled data to the sensing circuit.

In exemplary embodiments in accordance with principles of inventive concepts an electronic device includes a voltage regulator to down-regulate a voltage to a first voltage to which the push pull circuit is configured to develop one of the first and second paths according to data stored on the memory cell, the push pull circuit configured to develop the other of the first and second paths to ground.

In exemplary embodiments in accordance with principles of inventive concepts a memory device includes a memory cell including a push pull circuit; a sensing circuit connected to the memory cell to sense data stored in the memory cell by first and second paths which are separated from each other; and a sample and hold circuit connected between the memory cell and the sensing circuit to sample data stored in the memory cell and to provide the sampled data to the sensing circuit and a voltage regulator to down-regulate a voltage to a first voltage to which the push pull circuit is configured to develop one of the first and second paths according to data stored on the memory cell, the push pull circuit configured to develop the other of the first and second paths to ground.

In exemplary embodiments in accordance with principles of inventive concepts a system includes a controller and a memory cell including a push pull circuit; a sensing circuit connected to the memory cell to sense data stored in the memory cell by first and second paths which are separated from each other; and a sample and hold circuit connected between the memory cell and the sensing circuit to sample data stored in the memory cell and to provide the sampled data to the sensing circuit and a voltage regulator to down-regulate a voltage to a first voltage to which the push pull circuit is configured to develop one of the first and second paths according to data stored on the memory cell, the push pull circuit configured to develop the other of the first and second paths to ground.

In exemplary embodiments in accordance with principles of inventive concepts a system includes a controller, a display, and a memory cell including a push pull circuit; a sensing circuit connected to the memory cell to sense data stored in the memory cell by first and second paths which are separated from each other; and a sample and hold circuit connected between the memory cell and the sensing circuit to sample data stored in the memory cell and to provide the sampled data to the sensing circuit and a voltage regulator to down-regulate a voltage to a first voltage to which the push pull circuit is configured to develop one of the first and second paths according to data stored on the memory cell, the push pull circuit configured to develop the other of the first and second paths to ground, wherein the system is a wireless device.

BRIEF DESCRIPTION OF THE DRAWINGS

The above and other aspects and features of inventive concepts will become more apparent by describing in detail exemplary embodiments thereof with reference to the attached drawings, in which.

DETAILED DESCRIPTION

Figure 1:
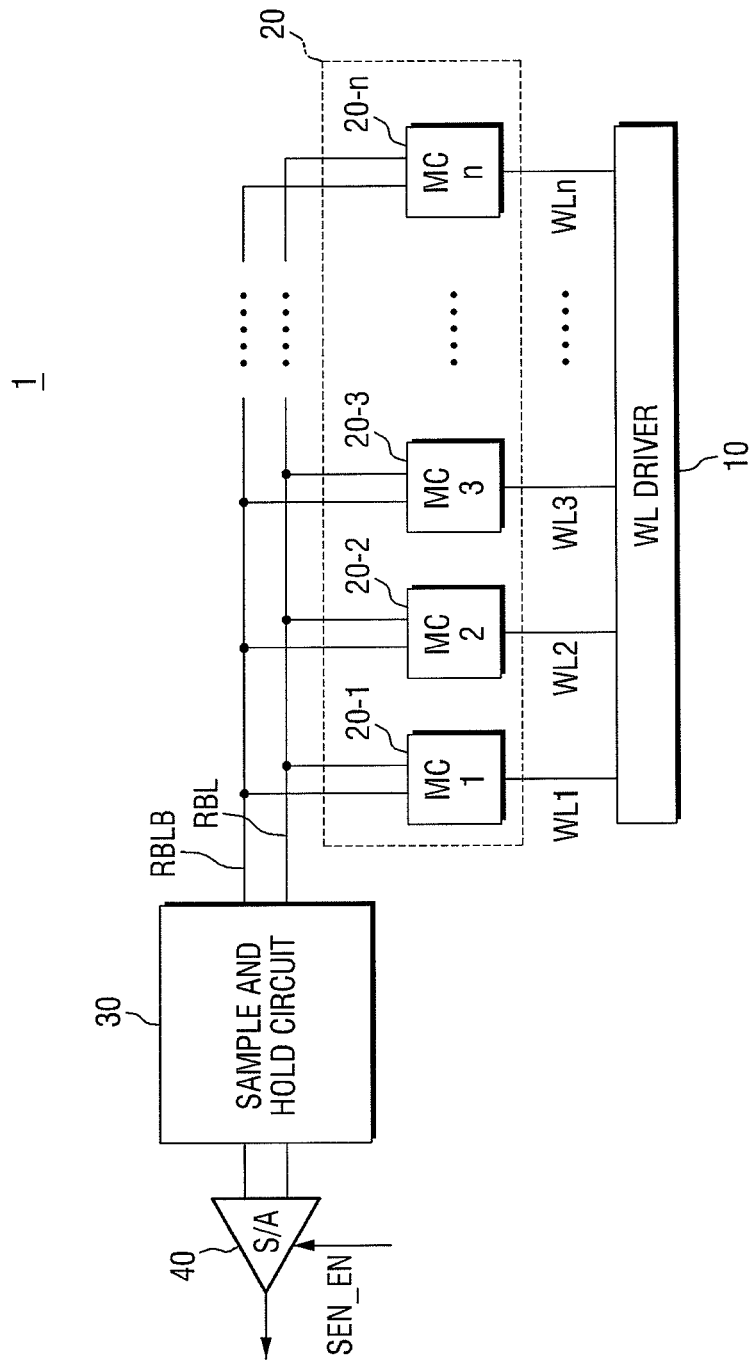
FIG. 1 is a block diagram of an exemplary embodiment of a memory in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

Hereinafter, an exemplary embodiment of a static random access memory (SRAM) in accordance with principles of inventive concepts will be described as an example of a memory device. However, inventive concepts are not limited to SRAM memory devices and may be employed by a variety of electronic circuits, including both volatile and nonvolatile memory devices.

An exemplary embodiment of a memory device in accordance with principles of inventive concepts in accordance with principles of inventive concepts will now be described with reference to FIGS. 1 through 4.

Figure 2:
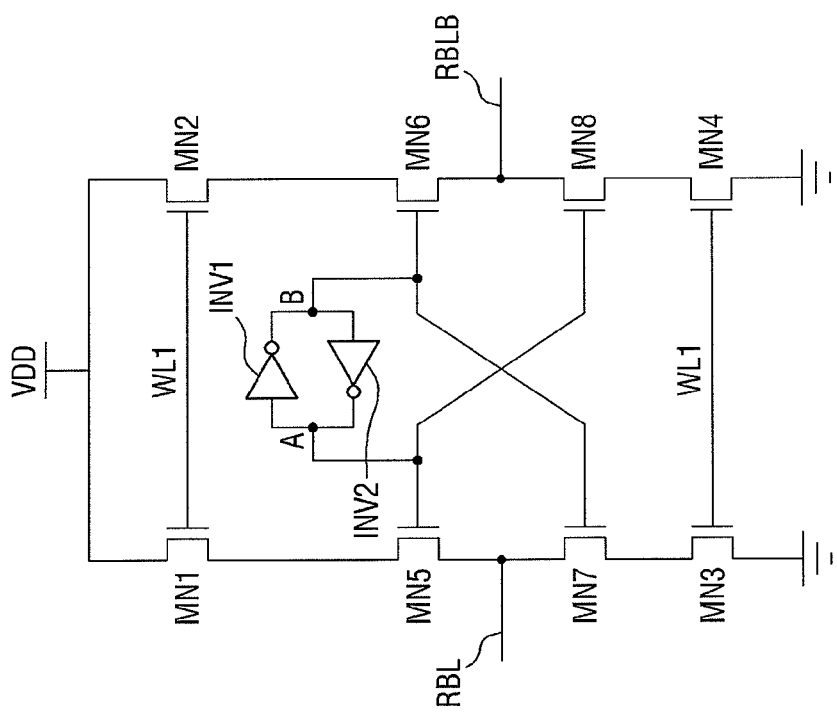
FIGS. 2 and 3 are exemplary circuit diagrams of a memory cell shown in FIG. 1.
Figure 3:
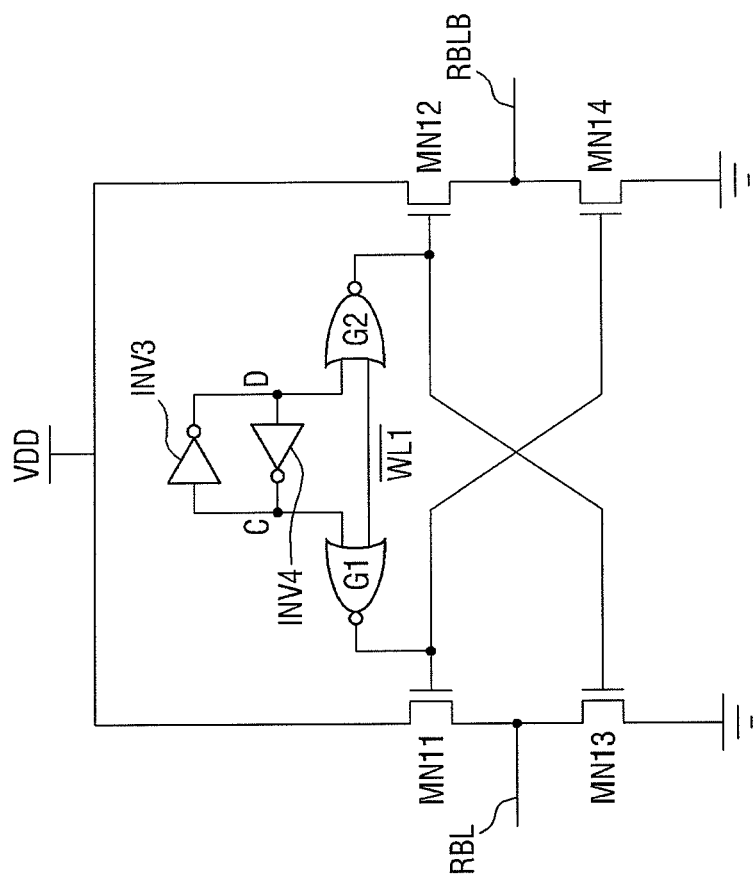
Figure 4:
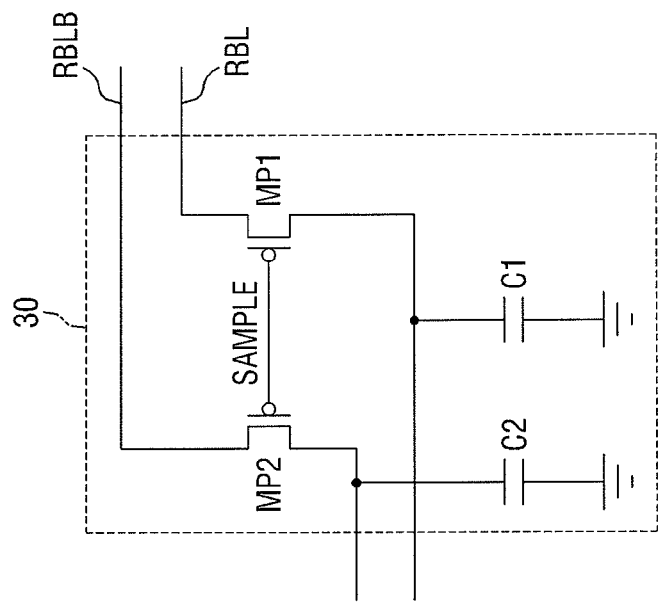
FIG. 4 is an exemplary circuit diagram of a sample and hold circuit shown in FIG. 1.

FIG. 1 is a block diagram of an exemplary embodiment of a memory device 1 in accordance with principles of inventive concepts. FIGS. 2 and 3 are exemplary circuit diagrams of a memory cell shown in FIG. 1. FIG. 4 is an exemplary circuit diagram of a sample and hold circuit 30 shown in FIG. 1.

Referring to FIG. 1, the memory device 1 includes a word line driver 10, a memory cell group 20, the sample and hold circuit 30, and a sensing circuit 40.

The word line driver 10 may be connected to each of a plurality of memory cells 20-1 through 20-$n$ included in the memory cell group 20. The word line driver 10 may transmit a plurality of word line signals WL1 through WLn to the memory cells 20-1 through 20-$n$, respectively. In a read operation of the memory device 1, the word line driver 10 may transmit the word line signals WL1 through WLn to the memory cells 20-1 through 20-$n$, respectively, so that the memory cells 20-1 through 20-$n$ may be selected.

The memory cell group 20 may include the memory cells 20-1 through 20-$n$, which may be disposed within a plurality of blocks. That is, each memory cell block may include some of the memory cells 20-1 through 20-$n$.

In exemplary embodiments in accordance with principles of inventive concepts, each of the memory cells 20-1 through 20-$n$ may be an SRAM cell. However, inventive concepts are not limited thereto, and each of the memory cells 20-1 through 20-$n$ may be any type of memory cell.

Data may be stored in each of the memory cells 20-1 through 20-$n$ according to a write method known to those of ordinary skill in the art to which inventive concepts pertain. The storing of the data in each of the memory cells 20-1 through 20-$n$ will not be described here in detail.

Each of the memory cells 20-1 through 20-$n$ according to the current exemplary embodiment may include pass transistors and a push-pull circuit. The configuration of each of the memory cells 20-1 through 20-$n$ according to the current exemplary embodiment will now be described in more detail with reference to FIGS. 2 and 3.

Each of the memory cells 20-1 through 20-$n$ according to the current exemplary embodiment may include a pair of inverters INV1 and INV2, pass transistors MN1 through MN4, and a push-pull circuit MN5 through MN8. FIG. 2 illustrates the exemplary configuration of the first memory cell 20-1 from among the memory cells 20-1 through 20-$n$.

Referring to FIG. 2, the inverters INV1 and INV2 may store data. For clarity and ease of description, data stored in each of the memory cells 20-1 through 20-$n$ may be defined as shown in Table 1 below.

TABLE 1

| Data | Node A | Node B |
|------|--------|--------|
| 0    | H      | L      |
| 1    | L      | H      |

In exemplary embodiments, when a voltage level of node A is a first level (e.g., a high level) and when a voltage level of node B is a second level (e.g., a low level), it is defined that data 0 (also referred to herein as logic level 0) is stored in each of the memory cells 20-1 through 20-$n$. When the voltage level of node A is the second level (e.g., the low level) and when the voltage level of node B is the first level (e.g., the high level), it is defined that data 1 (also referred to herein as logic level 1) is stored in each of the memory cells 20-1 through 20-$n$.

The pass transistors MN1 through MN4 may be gated by the first word line signal WL1 to provide a first voltage VDD or a second voltage GND to the push-pull circuit MN5 through MN8. Specifically, the first and second pass transistors MN1 and MN2 may be gated by the first word line signal WL1 to provide the first voltage VDD to the push-pull circuit MN5 through MN8. The third and fourth pass transistors MN3 and MN4 may be gated by the first word line signal WL1 to provide the second voltage GND to the push-pull circuit MN5 through MN8. The first voltage VDD may be a voltage provided to the memory device 1 (see FIG. 1) from an external source, and the second voltage GND may be a ground voltage, for example.

In FIG. 2, each of the first through fourth pass transistors MN1 through MN4 may be an n-channel metal oxide semi-conductor (NMOS) transistor which is turned on by the first word line signal WL1 at the first level (e.g., the high level). However, inventive concepts are not limited thereto. In other exemplary embodiments in accordance with principles of inventive concepts, each of the first through fourth pass transistors MN1 through MN4 may be a p-channel metal oxide semiconductor (PMOS) transistor which is turned on by the first word line signal WL1 at the second level (e.g., the low level), for example.

The push-pull circuit MN5 through MN8 may include a fifth pass transistor MN5 which is gated by the voltage level of node A to deliver the first voltage VDD to a first path RBL, a sixth pass transistor MN6 which is gated by the voltage level of node B to deliver the first voltage VDD to a second path RBLB, a seventh pass transistor MN7 which is gated by the voltage level of node B to deliver the second voltage GND to the first path RBL, and an eighth pass transistor MN8 which is gated by the voltage level of node A to deliver the second voltage GND to the second path RBLB.

In FIG. 2, each of the fifth through eighth pass transistors MN5 through MN8 is an NMOS transistor. However, inventive concepts are not limited thereto. In some other exemplary embodiments in accordance with principles of inventive concepts, each of the fifth through eighth pass transistors MN5 through MN8 may be a PMOS transistor, for example.

A method of operating the memory cell 20-1 in accordance with principles of inventive concepts will be described in greater detail later.

Each of the memory cells 20-1 through 20-n according to exemplary embodiments can also be implemented in another configuration. That is, each of memory cells 20-1 through 20-n according to another exemplary embodiment in accordance with principles of inventive concepts may include a pair of inverters INV3 and INV4, a pair of NOR gates G1 and G2, and a push-pull circuit MN11 and MN14, as shown in FIG. 3.

Referring to FIG. 3, like the inverters INV1 and INV2 of FIG. 2, the inverters INV3 and INV4 may store data. For clarity and ease of description, data stored in each of the memory cells 20-1 through 20-n may be defined as shown in Table 2 below.

TABLE 2

| Data | Node C | Node D |
|------|--------|--------|
| 0    | L      | H      |
| 1    | H      | L      |

That is, unlike in the embodiment of FIG. 2, in the embodiment of FIG. 3, when a voltage level of node C is the second level (e.g., the low level) and when a voltage level of node D is the first level (e.g., the high level), it is defined that data 0, or logic level zero, is stored in each of the memory cells 20-1 through 20-n. In addition, when the voltage level of node C is the first level (e.g., the high level) and when the voltage level of node D is the second level (e.g., the low level), it is defined that data 1, or logic level one, is stored in each of the memory cells 20-1 through 20-n.

The NOR gates G1 and G2 may control the push-pull circuit MN11 through MN14. That is, the first NOR gate G1 may determine whether the eleventh pass transistor MN11 is turned on, by performing an NOR operation on an inverted level of the first word line signal WL1 and the voltage level of node C and providing the result of the NOR operation to the eleventh pass transistor MN11. The second NOR gate G2 may determine whether the twelfth pass transistor MN12 is turned on, by performing an NOR operation on the inverted level of the first word line signal WL1 and the voltage level of node D and providing the result of the NOR operation to the twelfth pass transistor MN12.

The push-pull circuit MN11 through MN14 may include the eleventh pass transistor MN11, which is gated by an output of the first NOR gate G1 to deliver the first voltage VDD to the first path RBL, the twelfth pass transistor MN12, which is gated by an output of the second NOR gate G2 to deliver the first voltage VDD to the second path RBLB, a thirteenth pass transistor MN13, which is gated by the output of the second NOR gate G2 to deliver the second voltage GND to the first path RBL, and a fourteenth pass transistor MN14, which is gated by the output of the first NOR gate G1 to deliver the second voltage GND to the second path RBLB.

In FIG. 3, each of the eleventh through fourteenth pass transistors, MN11 through MN14, is an NMOS transistor. However, inventive concepts are not limited thereto. In some other exemplary embodiments in accordance with principles of inventive concepts, each of the eleventh through fourteenth pass transistors MN11 through MN14 may be a PMOS transistor, for example.

A method of operating the memory cell 20-1 in accordance with principles of inventive concepts will be described in greater detail later.

Referring back to FIG. 1, the sample and hold circuit 30 may be connected to each of the memory cells 20-1 through 20-n by the first and second paths RBL and RBLB, which are separated from each other. In an exemplary embodiment in accordance with principles of inventive concepts, the sample and hold circuit 30 may separate a section in which voltages of the first and second paths RBL and RBLB are developed by data stored in each of the memory cells 20-1 through 20-n from a section in which the sensing circuit 40 senses the data stored in each of the memory cells 20-1 through 20-n by detecting the developed voltages of the first and second paths RBL and RBLB. Such an operation in accordance with principles of inventive concepts will be described in more detail later.

Referring to FIG. 4, the sample and hold circuit 30 may include a first switch MP1 which is gated by a sampling signal SAMPLE to charge a first capacitor C1 with the voltage of the first path RBL and a second switch MP2 which is gated by the sampling signal SAMPLE to charge a second capacitor C2 with the voltage of the second path RBLB. The voltages charged in the first and second capacitors C1 and C2 may be provided to the sensing circuit 40 (see FIG. 1) and then used by the sensing circuit 40 (FIG. 1) to sense the data stored in each of the memory cells 20-1 through 20-n.

In FIG. 4, the first and second switches MP1 and MP2 are PMOS transistors which are turned on by the sampling signal SAMPLE at the second level (e.g., the low level). However, inventive concepts are not limited thereto. In exemplary embodiments in accordance with principles of inventive concepts, the first and second switches MP1 and MP2 may be NMOS transistors which are turned on by the sampling signal SAMPLE at the first level (e.g., the high level), for example.

Referring back to FIG. 1, the sensing circuit 40 may be connected to the sample and hold circuit 30 and each of the memory cells 20-1 through 20-n by the first and second paths RBL and RBLB, which are separated from each other. The sensing circuit 40 may be enabled by a sense enable signal SEN_EN to detect the voltages of the first and second capacitors C1 and C2 (see FIG. 4), which are charged with the voltages of the first and second paths RBL and RBLB, and sense the data stored in each of the memory cells 20-1 through 20-n based on the detected voltages.

For example, if the voltages of the first path RBL and the first capacitor C1 are greater than the voltages of the second path RBLB and the second capacitor C2, the sensing circuit 40, when enabled by the sense enable signal SEN_EN, may determine that data 0, or logic level zero, is stored in the memory cells 20-1 through 20-n. If, on the other hand, the voltages of the first path RBL and the first capacitor C1 are smaller than the voltages of the second path RBLB and the second capacitor C2, the sensing circuit 40, when enabled by the sense enable signal SEN_EN, may determine that data 1, or logic level one, is stored in the memory cells 20-1 through 20-n.

The sensing circuit 40 may be implemented as a sense amplifier as shown in FIG. 1. However, inventive concepts are not limited thereto.

Operation of the memory device 1 according to exemplary embodiments will now be described with reference to FIGS. 1, and 5 through 9.

Figure 5:
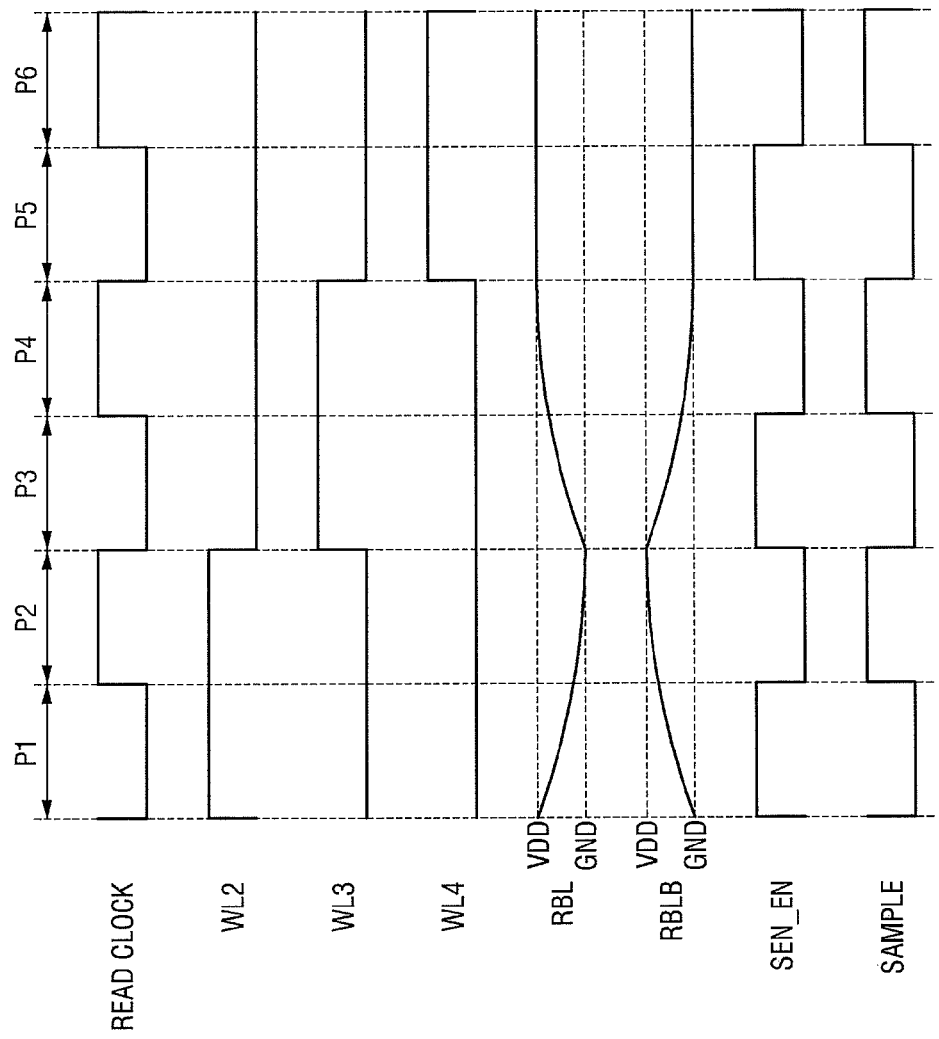
FIG. 5 is an operation timing diagram of the exemplary embodiment of a memory device shown in FIG. 1.

FIG. 5 is an exemplary timing diagram of the memory device 1 shown in FIG. 1. FIGS. 6 through 9 are diagrams illustrating exemplary operation of the memory device 1 shown in FIG. 1.

For clarity and ease of description, it is assumed that data 0 is stored in the first memory cell 20-1, that data 1 is stored in the second memory cell 20-2, and that data 0 is stored in each of the third and fourth memory cells 20-3 and 20-4. In addition, an exemplary embodiment in which each of the memory cells 20-1 through 20-n according to exemplary embodiments is configured like the circuit shown in FIG. 2 will be referred to as a first case, and an exemplary embodiment in which each of the memory cells 20-1 through 20-n according to exemplary embodiments is configured like the circuit shown in FIG. 3 will be referred to as a second case. To summarize, the first through third memory cells 20-1 through 20-3 may be in the states shown in Table. 3 below.

TABLE 3

| | Stored data | CASE 1 Node A | CASE 1 Node B | CASE 2 Node C | CASE 2 Node D |
|---|---|---|---|---|---|
| MC1(20-1) | 0 | H | L | L | H |
| MC2(20-2) | 1 | L | H | H | L |
| MC3(20-3) | 0 | H | L | L | H |
| MC4(20-4) | 0 | H | L | L | H |

Referring to FIG. 5, a start point of a first section P1 comes after the first and second paths RBL and RBLB are developed by data stored in the first memory cell 20-1. In other words, a section in which the first and second paths RBL and RBLB are developed by the data stored in the first memory cell 20-1 may be a zeroth section (not shown).

Therefore, at the start point of the first section P1, a voltage level of the first path RBL may be the first level (e.g., the high level), and a voltage level of the second path RBLB may be the second level (e.g., the low level). This will be described in more detail below.

First, an exemplary embodiment in which the memory cells 20-1 through 20-n according to exemplary embodiments are configured as in the first case will be described.

It was assumed earlier that data 0 is stored in the first memory cell 20-1. Therefore, referring to FIG. 6, the voltage level of node A is the first level (e.g., the high level), and the voltage level of node B is the second level (e.g., the low level). Accordingly, the fifth pass transistor MN5 and the eighth pass transistor MN8 are turned on, whereas the sixth pass transistor MN6 and the seventh pass transistor MN7 are turned off.

Figure 6:
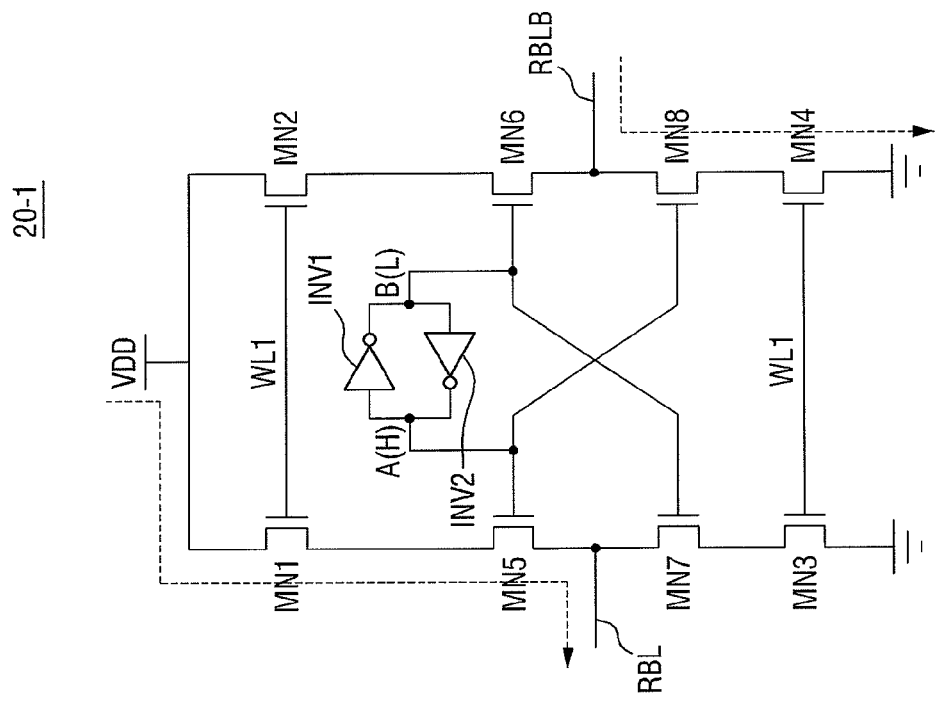
FIGS. 6 through 9 are diagrams illustrating the operation of the exemplary embodiment of a memory device shown in FIG. 1.
Figure 7:
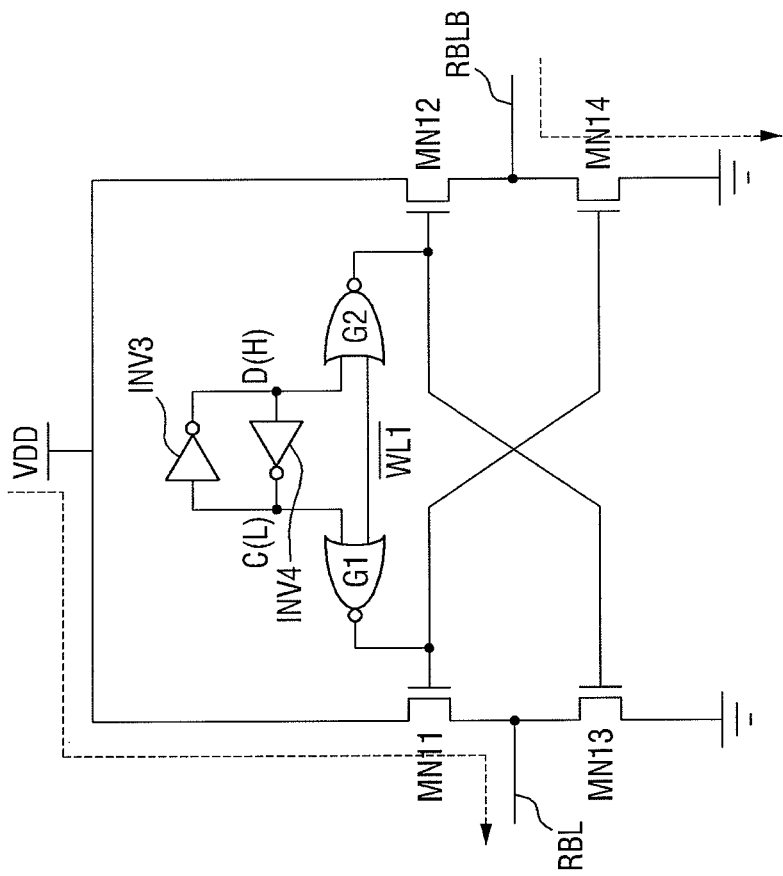

In such a situation, if the first through fourth pass transistors MN1 through MN4 are turned on by the first word line signal WL1 (not shown in FIG. 5) at the first level (e.g., the high level), the first path RBL develops to the first voltage VDD, and the second path RBLB develops to the second voltage GND, as illustrated by the dashed lines of FIG. 6. As a result, the voltage level of the first path RBL rises up to the first voltage VDD to become the first level (e.g., the high level), and the voltage level of the second path RBLB falls up to the second voltage GND to become the second level (e.g., the low level).

Next, an exemplary embodiment in which the memory cells 20-1 through 20-n according to exemplary embodiments are configured as in the second case will be described.

It was assumed earlier that data 0 is stored in the first memory cell 20-1. Therefore, referring to FIG. 7, the voltage level of node C is the second level (e.g., the low level), and the voltage level of node D is the first level (e.g., the high level). If the first word line signal WL1 (not shown) at the first level (e.g., the high level) is transmitted; the inverted level of the first word line signal WL1 (not shown) is the second level (e.g., the low level). Accordingly, the output of the first NOR gate G1 goes to the first level (e.g., the high level), and the output of the second NOR gate G2 goes to the second level (e.g., the low level).

When the output of the first NOR gate G1 is at the first level (e.g., the high level), the eleventh pass transistor MN11 and the fourteenth pass transistor MN14 are turned on and the twelfth pass transistor MN12 and the thirteenth pass transistor MN13 are turned off.

Therefore, the first path RBL develops to the first voltage VDD, and the second path RBLB develops to the second voltage GND. As a result, the voltage level of the first path RBL rises up to the first voltage VDD to become the first level (e.g., the high level), and the voltage level of the second path RBLB falls up to the second voltage GND to become the second level (e.g., the low level).

Referring back to FIG. 5, in the first section P1, a read clock READ CLOCK goes to the second level (e.g., the low level), thereby changing the level of the sense enable signal SEN_EN to the first level (e.g., the high level) and changing the level of the sampling signal SAMPLE to the second level (e.g., the low level). Accordingly, the first and second capacitors C1 and C2 of the sample and hold circuit 30 are charged with the voltages of the first and second paths RBL and RBLB, respectively, and the sensing circuit 40 senses data 0 stored in the first memory cell 20-1 by detecting the voltages charged in the first and second capacitors C1 and C2. In some exemplary embodiments, a duty cycle of the read clock READ CLOCK may be different from that of the sense enable signal SEN_EN. Also, the duty cycle of the read clock READ CLOCK may be different from that of the sampling signal SAMPLE.

Meanwhile, in the first section P1, the second word line signal WL2 is transmitted to the second memory cell 20-2. That is, the level of the second word line signal WL2 changes from the second level (e.g., the low level) to the first level (e.g., the high level). Accordingly, the voltages of the first and second paths RBL and RBLB develop according to data stored in the second memory cell 20-2. This eventuality now be described in more detail with reference to FIGS. 8 and 9.

Figure 8:
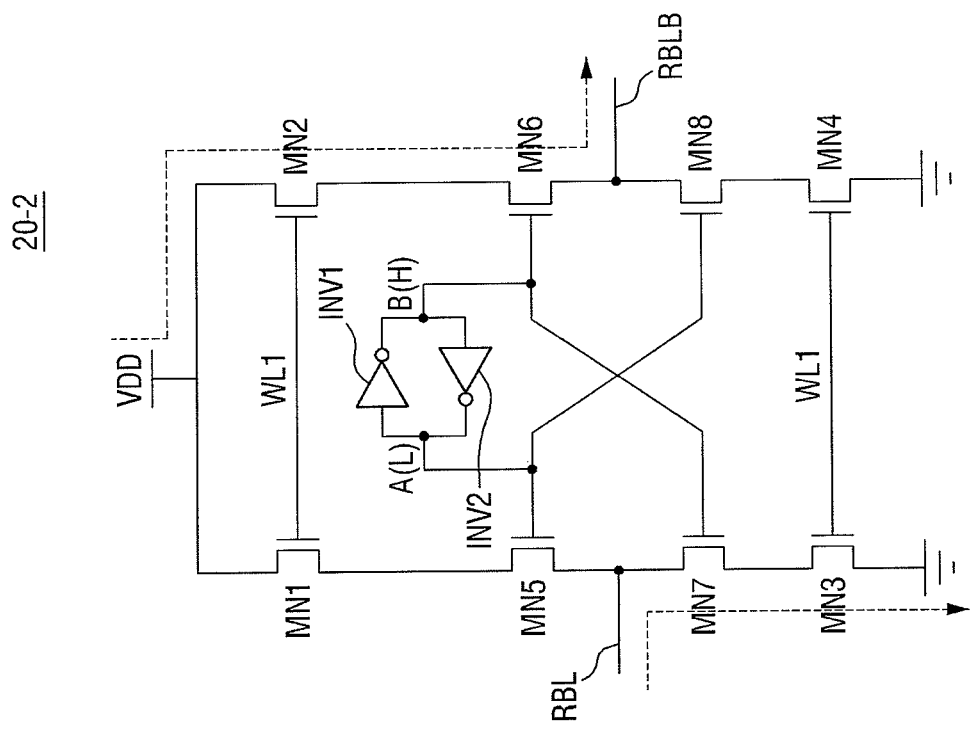

First, a situation in which the memory cells 20-1 through 20-n are configured as in the first case will be described with reference to FIG. 8.

It was assumed earlier that data 1 is stored in the second memory cell 20-2. Therefore, referring to FIG. 8, the voltage level of node A is the second level (e.g., the low level), and the voltage level of node B is the first level (e.g., the high level). Accordingly, the sixth pass transistor MN6 and the seventh pass transistor MN7 are turned on, and the fifth pass transistor MN5 and the eighth pass transistor MN8 are turned off.

Because the second word line signal WL2 at the first level (e.g., the high level) is transmitted to the second memory cell 20-2 in the first section P1, the first through fourth pass transistors MN1 through MN4 are turned on. As a result, as illustrated by the broken lines of FIG. 8, the second path RBLB develops to the first voltage VDD, and the first path RBL develops to the second voltage GND. That is, as illustrated in the FIG. 5, the voltage level of the first path RBL falls gradually, and the voltage level of the second path RBLB rises gradually.

Figure 9:
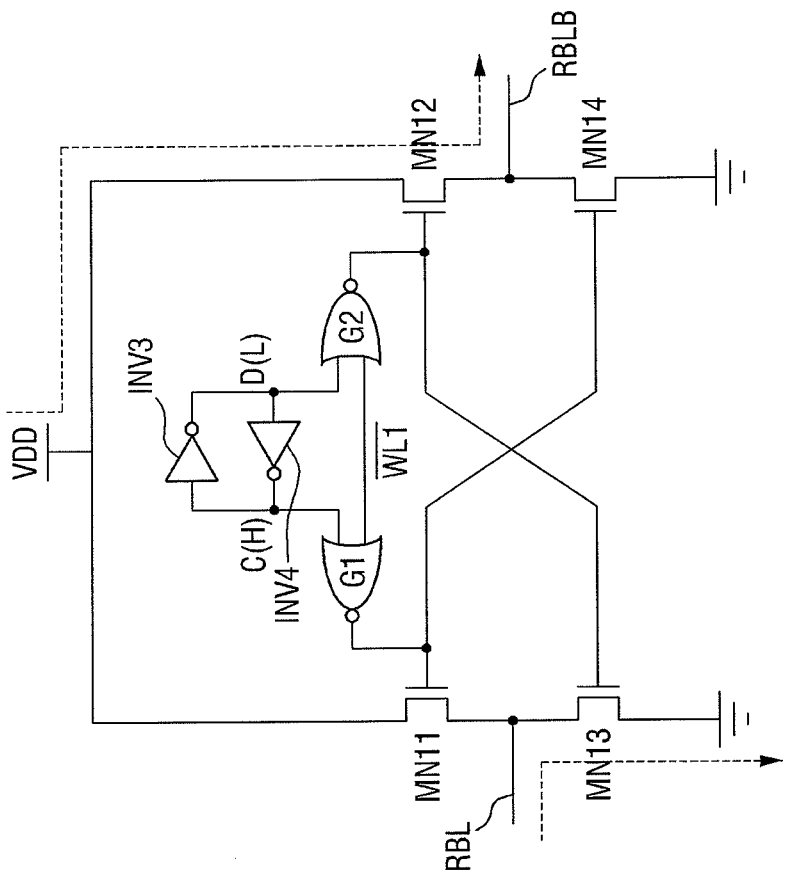

Next, a situation in which the memory cells 20-1 through 20-n according to exemplary embodiments are configured as in the second case will be described with reference to FIG. 9.

It was assumed earlier that data 1 is stored in the second memory cell 20-2. Therefore, referring to FIG. 9, the voltage level of node C is the first level (e.g., the high level), and the voltage level of node D is the second level (e.g., the low level).

Because the second word line signal WL2 at the first level (e.g., the high level) is transmitted to the second memory cell 20-2 in the first section P1, the inverted level of the second word line signal WL2 is the second level (e.g., the low level). Accordingly, the output of the first NOR gate G1 goes to the second level (e.g., the low level), and the output of the second NOR gate G2 goes to the first level (e.g., the high level).

When the output of the first NOR gate G1 is at the second level (e.g., the low level), the eleventh pass transistor MN11 and the fourteenth pass transistor MN14 are turned off, and the twelfth pass transistor MN12 and the thirteenth pass transistor MN13 are turned on.

Therefore, the second path RBLB develops to the first voltage VDD, and the first path RBL develops to the second voltage GND. That is, as illustrated in FIG. 5, the voltage level of the first path RBL falls gradually, and the voltage level of the second path RBLB rises gradually.

In summary, in the first section P1 of FIG. 5, the sensing circuit 40 of the memory device 1 senses data stored in the first memory cell 20-1 through the sample and hold circuit 30, and each of the first and second paths RBL and RBLB develops according to data stored in the second memory cell 20-2.

In a second section P2 of FIG. 5, the read clock READ CLOCK goes to the first level (e.g., the high level), thereby changing the level of the sense enable signal SEN_EN to the second level (e.g., the low level) and changing the level of the sampling signal SAMPLE to the first level (e.g., the high level). Accordingly, the operation of reading the data stored in the first memory cell 20-1 is completed.

Meanwhile, because the second word line signal WL2 is still maintained at the first level (e.g., the high level), each of the first and second paths RBL and RBLB develops according to the data stored in the second memory cell 20-2.

In a third section P3, the read clock READ CLOCK goes to the second level (e.g., the low level), thereby changing the sense enable signal SEN_EN again to the first level (e.g., the high level) and changing the level of the sampling signal SAMPLE again to the second level (e.g., the low level). In this case the first and second capacitors C1 and C2 of the sample and hold circuit 30 are charged with the voltages of the first and second paths RBL and RBLB, respectively. That is, the first capacitor C1 is charged with the second voltage GND, and the second capacitor C2 is charged with the first voltage VDD. The sensing circuit 40 senses data 1 stored in the second memory cell 20-2 by detecting the second voltage GND and the first voltage VDD.

In the third section P3, the third word line signal WL3 is transmitted to the third memory cell 20-3. That is, a level of the third word line signal WL3 changes from the second level (e.g., the low level) to the first level (e.g., the high level). Accordingly, the voltages of the first and second paths RBL and RBLB develop according to data stored in the third memory cell 20-3.

It was assumed earlier that data 0 is stored in the third memory cell 20-3. Therefore, as described above with reference to FIGS. 6 and 7, the voltage level of the first path RBL rises gradually, and the voltage level of the second path RBLB falls gradually. Because this has been fully described above, for clarity and conciseness, the description will not be repeated here.

In a fourth section P4, the read clock READ CLOCK goes to the first level (e.g., the high level), thereby changing the level of the sense enable signal SEN_EN again to the second level (e.g., the low level) and changing the level of the sampling signal SAMPLE again to the first level (e.g., the high level). Accordingly, the operation of reading the data stored in the second memory cell 20-2 is completed.

Meanwhile, because the third word line signal WL3 is still maintained at the first level (e.g., the high level), each of the first and second paths RBL and RBLB develops according to the data stored in the third memory cell 20-3.

In a fifth section P5, the read clock READ CLOCK goes to the second level (e.g., the low level), thereby changing the sense enable signal SEN_EN again to the first level (e.g., the high level) and changing the level of the sampling signal SAMPLE again to the second level (e.g., the low level). In this case the first and second capacitors C1 and C2 of the sample and hold circuit 30 are charged with the voltages of the first and second paths RBL and RBLB, respectively. That is, the first capacitor C1 is charged with the first voltage VDD, and the second capacitor C2 is charged with the second voltage GND. The sensing circuit 40 senses data 0 stored in the third memory cell 20-3 by detecting the first voltage VDD and the second voltage GND.

In the fifth section P5, the fourth word line signal WL4 is transmitted to the fourth memory cell 20-4. That is, the level of the fourth word line signal WL4 changes from the second level (e.g., the low level) to the first level (e.g., the high level). Accordingly, the voltages of the first and second paths RBL and RBLB develop according to data stored in the fourth memory cell 20-4.

It was assumed earlier that data 0 is stored in the fourth memory cell 20-4, as in the third memory cell 20-3. Therefore, the voltage level of the first path RBL and the voltage level of the second path RBLB may remain unchanged as illustrated in FIG. 5.

Finally, in a sixth section P6, the read clock READ CLOCK goes to the first level (e.g., the high level), thereby changing the level of the sense enable signal SEN_EN again to the second level (e.g., the low level) and changing the level of the sampling signal SAMPLE again to the first level (e.g., the high level). Accordingly, the operation of reading the data stored in the third memory cell 20-3 is completed.

In summary, the memory device 1 according to exemplary embodiments does not pre-charge the first and second paths RBL and RBLB to read data stored in each of the memory cells 20-1 through 20-n. That is, after reading data stored in the first memory cell 20-1, the memory device 1 does not pre-charge the first and second paths RBL and RBLB to read data stored in the second memory cell 20-2. This operation in accordance with principles of inventive concepts increases the speed of a read operation and reduces power consumption during the read operation.

Specifically, in a conventional memory device, readout clock frequency F1 can be calculated by below formula (1);

$$F1=1/(x+y+z)(x\text{:pre-charge time},y\text{:developing time},z\text{:sensing time}) \quad \text{(Formula 1)}$$

But, in the memory device 1 in accordance with principles of inventive concepts, readout clock (READOUT of FIG. 5) frequency F2 can be calculated by below formula (2);

$$F2=1/\text{MAX}(y,z)(y\text{:developing time},z\text{:sensing time}) \quad \text{(Formula 2)}$$

That is, the elimination of the precharge time allows a memory device and method in accordance with principles of inventive concepts to be read at a higher rate than a conventional memory device.

In the memory device 1 according to exemplary embodiments, a section, (also referred to herein as a time segment or read process step), in which the voltages of the first and second paths RBL and RBLB develop according to data stored in each of the memory cells 20-1 through 20-n is separated from a section in which the data stored in each of the memory cells 20-1 through 20-n is sensed based on the developed voltages of the first and second paths RBL and RBLB. That is, in the example of FIG. 5, the section in which the voltages of the first and second paths RBL and RBLB develop according to the data stored in the second memory cell 20-2 is the first and second sections P1 and P2. However, the section in which the sensing circuit 40 senses the data stored in the second memory cell 20-2 through the sample and hold circuit 30 is the third section P3. If the section in which the voltages of the first and second paths RBL and RBLB develop according to the data stored in each of the memory cells 20-1 through 20-n is separated from the section in which the data stored in each of the memory cells 20-1 through 20-n is sensed based on the developed voltages of the first and second paths RBL and RBLB, the reliability of the read operation may be improved.

Specifically, within the same read clock READ CLOCK, the voltages of the first and second paths RBL and RBLB may develop according to data stored in a memory cell (e.g., 20-2), and the data stored in the memory cell (e.g., 20-2) may be sensed based on the developed voltages of the first and second paths RBL and RBLB. In such a situation, the sensing operation may affect the developing operation of the first and second paths RBL and RBLB. However, in the memory device 1 according to exemplary embodiments, the sensing operation and the developing operation are performed in different sections (or different read clocks READ CLOCK). Therefore, the reliability of the read operation can be improved further.

Additionally, the memory device 1 according to exemplary embodiments does not perform a pre-charge operation when successively reading memory cells that store the same data, as in the case of the third memory cell 20-3 and the fourth memory cell 20-4. Therefore, there is no need to develop the first and second paths RBL and RBLB. This can reduce unnecessary power consumption during the read operation.

Additionally, according to the memory device 1 according to exemplary embodiments, sensing operation and voltage development happens in same period of time (P1, P3 and P5 of FIG. 5), thereby speed of read operation can be improved.

An exemplary embodiment of a memory device according to another exemplary embodiment in accordance with principles of inventive concepts will now be described with reference to FIGS. 10 through 12.

Figure 10:
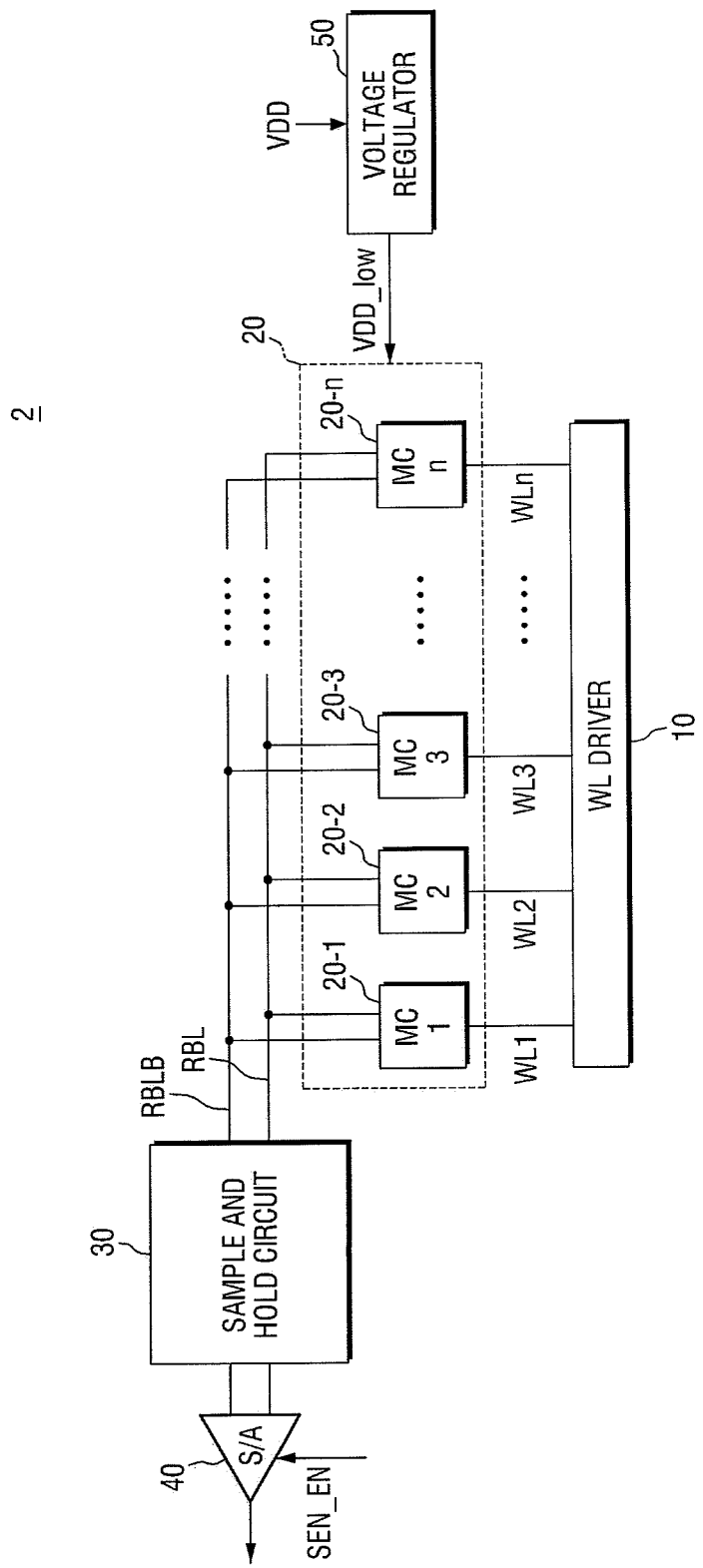
FIG. 10 is a block diagram of another exemplary embodiment of a memory device in accordance with principles of inventive concepts.
Figure 11:
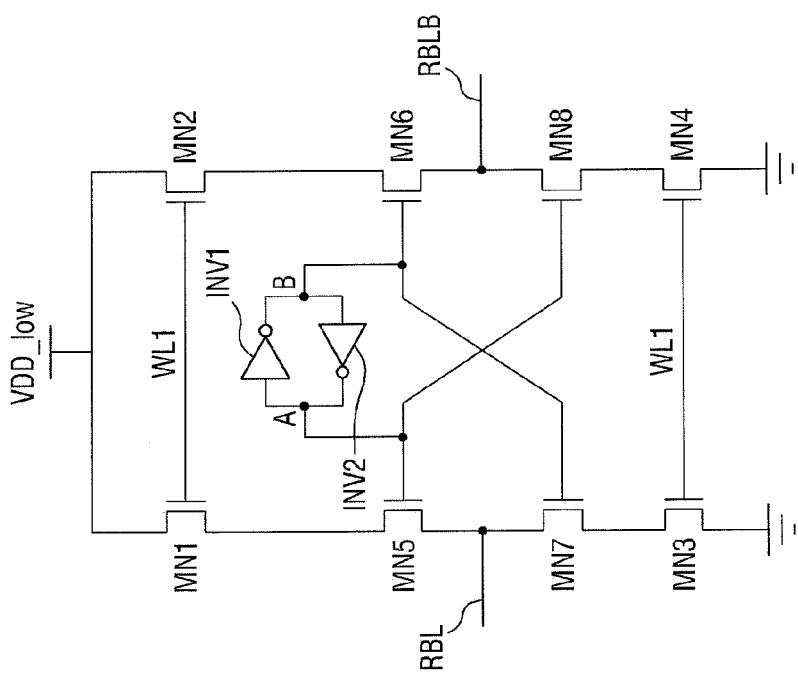
FIGS. 11 and 12 are exemplary circuit diagrams of a memory cell such as that shown in FIG. 10.

FIG. 10 is a block diagram of an exemplary embodiment of a memory device 2 according to another exemplary embodiment in accordance with principles of inventive concepts. FIGS. 11 and 12 are exemplary circuit diagrams of a memory cell such as that shown in FIG. 10. For simplicity, a description of elements substantially identical to those of the above-described embodiment described above will not be repeated here, and differences between the current and previous embodiments will be the focus of the description.

Referring to FIG. 10, the memory device 2 may further include a voltage regulator 50.

The voltage regulator 50 may regulate a first voltage VDD applied to the memory device 2 from an external source to a third voltage VDD_low which is lower than the first voltage VDD and provide the third voltage VDD_low to a memory cell group 20. Specifically, the voltage regulator 50 may regulate the first voltage VDD applied to the memory device 2 from the external source to the third voltage VDD_low which is lower than the first voltage VDD and provide the third voltage VDD_low to a push-pull circuit included in each of a plurality of memory cells 20-1 through 20-n. Accordingly, the push-pull circuit included in each of the memory cells 20-1 through 20-n may develop any one of first and second paths RBL and RBLB according to data stored in each of the memory cells 20-1 through 20-n and develop the other one of the first and second paths RBL and RBLB to a second voltage GND.

Specifically, if each of the memory cells 20-1 through 20-n according to exemplary embodiments is configured as in the first case described above; its configuration may be as shown in FIG. 11.

In this case, if data is stored in the memory cell 20-1 is 0, the voltage level of the first path RBL may develop to the third voltage VDD_low, and the voltage level of the second path RBLB may develop to the second voltage GND. In addition, if the data stored in the memory cell 20-1 is a logic level 1, the voltage level of the first path RBL may develop to the second voltage GND, and the voltage level of the second path RBLB may develop to the third voltage VDD_low. Because this general operation has been fully described above with reference to FIG. 6, the detailed description thereof will not be repeated here.

Figure 12:
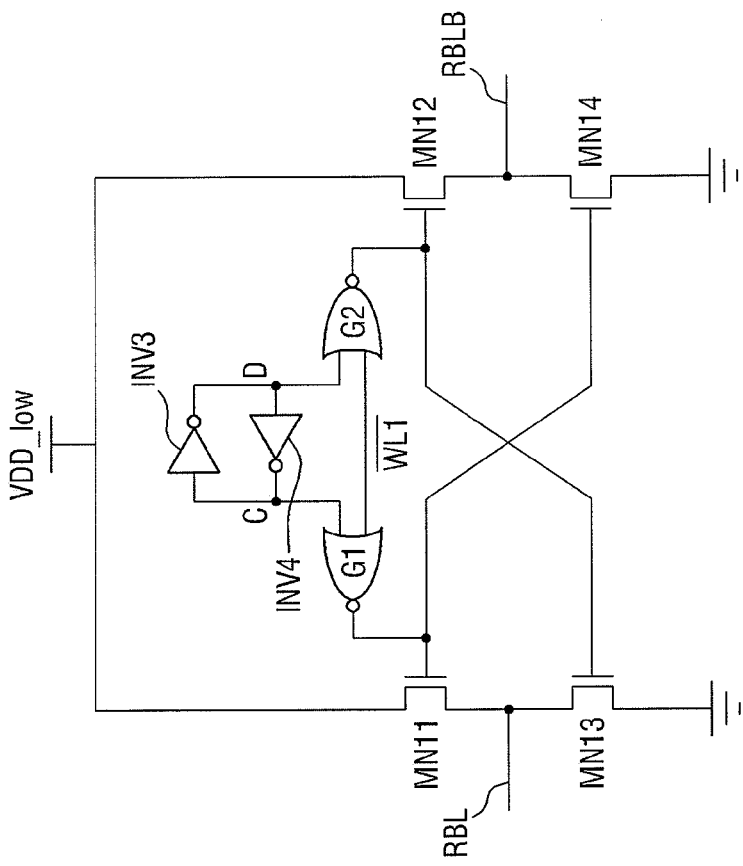

If each of the memory cells 20-1 through 20-n according to exemplary embodiments is configured as in the second case described above, such a configuration may be as shown in FIG. 12. In this case, if data is stored in the memory cell 20-1 is a logic level 0, the voltage level of the first path RBL may develop to the third voltage VDD_low, and the voltage level of the second path RBLB may develop to the second voltage GND. In addition, if the data is stored in the memory cell 20-1 is 1, the voltage level of the first path RBL may develop to the second voltage GND, and the voltage level of the second path RBLB may develop to the third voltage VDD_low. Because this general operation has been fully described above with reference to FIG. 7, the detailed description thereof will not be repeated here.

As described above, in exemplary embodiments in accordance with principles of inventive concepts, the voltage regulator 50 regulates the first voltage VDD applied to the memory device 2 from the external source to the third voltage VDD_low which is lower than the first voltage VDD and provides the third voltage VDD_low to the memory cell group 20. Accordingly, the first and second paths RBL and RBLB may develop to the third voltage VDD_low, not the first voltage VDD, thereby reducing power consumption and increasing the speed of a read operation.

In exemplary embodiments in accordance with principles of inventive concepts a memory device includes a sample and hold circuit connected between bit lines and a sense amplifier that separates the bit lines' charging and sensing phases and, as a result, the sensing phase does not decrease the time of the discharge phase, thereby enabling simpler synchronization.

Each memory cell, such as a RAM cell, may include a push pull driver that may be connected to a relatively low voltage supply (around 100 mV in exemplary embodiments). Use of an externally controlled low voltage supply allows accurate control of readout power consumption, independent of process voltage temperature (PVT). Use of push pull drivers in RAM cells also eliminates the need for a precharge phase in a readout operation, allowing for the use of all the time for bit line charging, easing synchronization and eliminating dependence of the readout clock duty cycle. Additionally, if consequentially read cells have the same values, no power will be consumed from the supply. That is, in a conventional readout scheme, typically, one of the bit lines will always be discharged regardless of cell value and then require recharging during a precharge phase, thus consuming greater power than a memory device and method in accordance with principles of inventive concepts.

Figure 13:
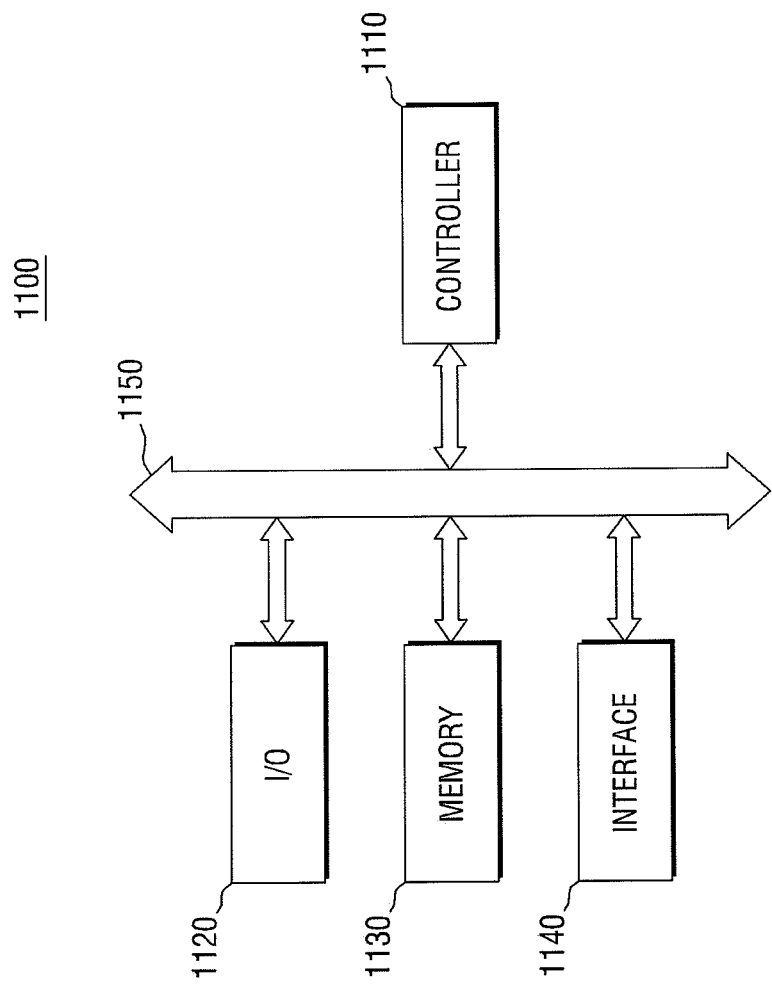
FIG. 13 is a block diagram of an electronic system including memory devices in accordance with principles of inventive concepts.

FIG. 13 is a block diagram of an electronic system 1100 including memory devices according to exemplary embodiments in accordance with principles of inventive concepts.

Referring to FIG. 13, the electronic system 1100 in accordance with principles of inventive concepts may include a controller 1110, an input/output (I/O) device 1120, a memory device 1130, an interface 1140, and a bus 1150.

The controller 1110, the I/O device 1120, the memory device 1130, and/or the interface 1140 may be coupled to each other through the bus 1150. The bus 1150 corresponds to a path through which data transfer.

The controller 1110 may include at least one of a microprocessor, a digital signal processor, a microcontroller, and at least one of logic devices capable of performing similar functions to the above elements.

The I/O device 1120 may include a keypad, a keyboard, and a display device. The memory device 1130 may store data and/or commands.

The interface 1140 may transmit data to a communication network or receive data from the communication network. The interface 1140 can be in a wired or wireless form. For example, the interface 1140 may be an antenna or a wired/wireless transceiver.

Although not shown in the drawing, the electronic system 1100 may further include a high-speed dynamic random access memory (DRAM) and/or a high-speed SRAM as an operation memory for improving the operation of the controller 1110. The memory devices 1 and 2 according to the above-described exemplary embodiments in accordance with principles of inventive concepts can be employed in the controller 1110, for example.

The memory devices 1 and 2 according to the above-described exemplary embodiments in accordance with principles of inventive concepts may be provided within the memory device 1130 or provided as a part of the I/O device 1120, for example.

The electronic system 1100 can be implemented as a personal digital assistant (PDA), a portable computer, a web tablet, a wireless phone, a mobile phone, a digital music player, a memory card, an electronic product capable of transmitting and/or receiving information in a wireless environment, a personal computer, an industrial computer, or a logic system performing various functions.

Figure 14:
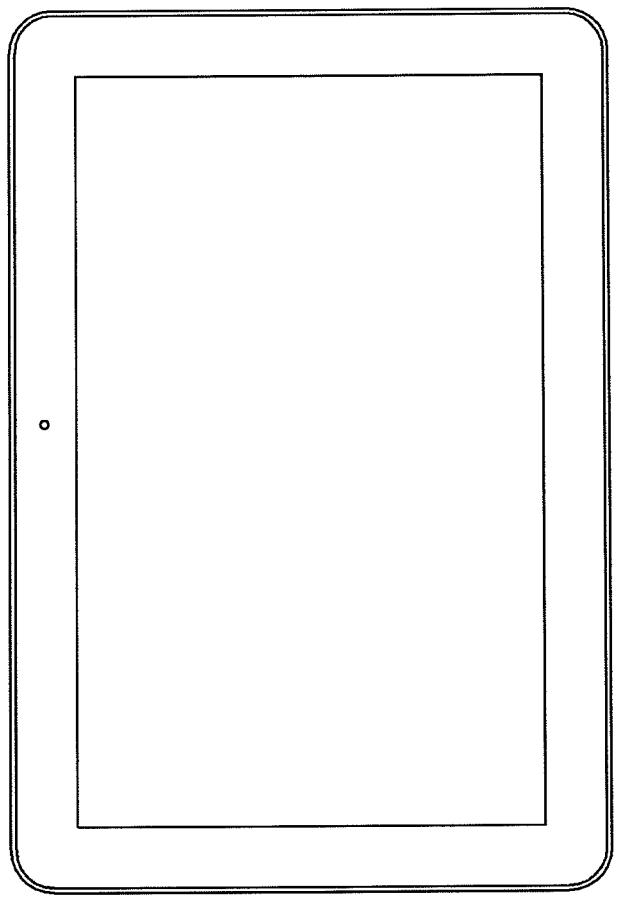
FIGS. 14 and 15 are diagrams showing exemplary semiconductor systems to which memory devices in accordance with principles of inventive concepts can be applied.
Figure 15:
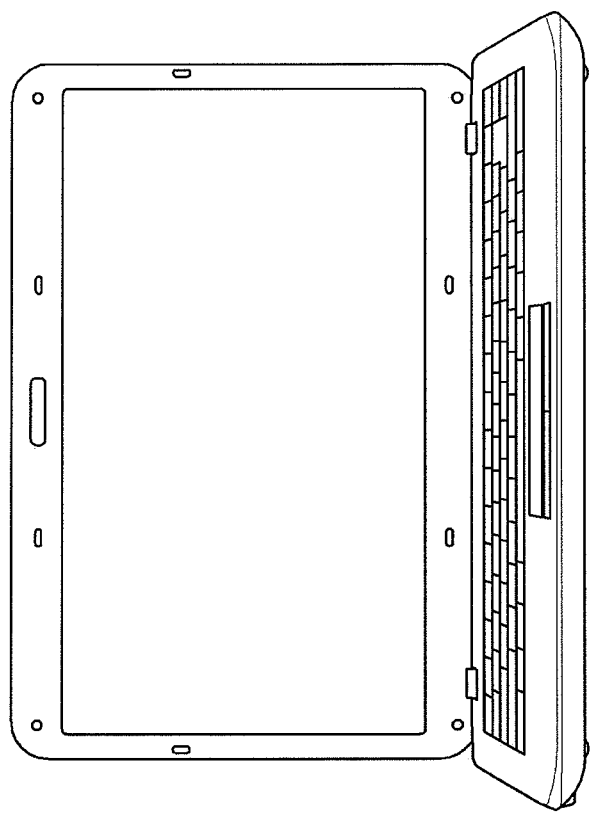

FIGS. 14 and 15 are diagrams showing exemplary semiconductor systems to which memory devices according to exemplary embodiments in accordance with principles of inventive concepts can be applied.

FIG. 14 shows a tablet PC, and FIG. 15 shows a notebook computer. At least one of the memory devices 1 and 2 according to the above-described exemplary embodiments in accordance with principles of inventive concepts can be used in a tablet PC, a notebook computer, a smart phone, and the like. Memory devices 1 and 2 according to the exemplary embodiments in accordance with principles of inventive concepts are also applicable to other integrated circuit devices not shown in the drawings.

In concluding the detailed description, those skilled in the art will appreciate that many variations and modifications can be made to exemplary embodiments without substantially departing from the principles of inventive concepts. The disclosed exemplary embodiments of the invention are used in a descriptive sense only and not for purposes of limitation.

What is claimed is:

1. A memory device comprising:
   a memory cell;
   a sensing circuit connected to the memory cell to sense data stored in the memory cell by first and second paths which are separated from each other; and
   a sample and hold circuit connected between the memory cell and the sensing circuit to separate a period during which voltages of the first and second paths are developed by the data stored in the memory cell from a period during which the sensing circuit senses the data stored in the memory cell by detecting the developed voltages of the first and second paths,
   wherein the memory cell comprises a push-pull circuit to develop either of the first and second paths to a first voltage according to the data stored in the memory cell and to develop the other one of the first and second paths to a second voltage which is different from the first voltage.

2. The memory device of claim 1, wherein the first voltage is a supply voltage supplied to the memory device, and the second voltage comprises a ground voltage.

3. The memory device of claim 1, further comprising a voltage regulator to regulate a third voltage provided to the memory device to the first voltage which is lower than the third voltage and to provide the first voltage to the push-pull circuit, wherein the second voltage comprises the ground voltage.

4. The memory device of claim 1, wherein the memory cell further comprises at least one inverter and at least one pass transistor which is gated by a word line signal to provide the first voltage or the second voltage to the push-pull circuit.

5. The memory device of claim 1, wherein the memory cell further comprises at least one inverter and at least one NOR gate which is gated by a word line signal to control the push-pull circuit.

6. The memory device of claim 1, wherein the memory cell comprises a static random access memory (SRAM) cell.

7. The memory device of claim 1, wherein the sample and hold circuit comprises:
a first switch gated by a sampling signal to charge a first capacitor with the voltage of the first path; and
a second switch gated by the sampling signal to charge a second capacitor with the voltage of the second path.

8. The memory device of claim 7, wherein the sensing circuit is configured to sense the data stored in the memory cell based on a difference between the voltage charged in the first capacitor and the voltage charged in the second capacitor.

9. A method of operating a memory device, the method comprising:
developing voltages of first and second paths in a sample and hold circuit according to data stored in a first memory cell;
sensing the data stored in the first memory cell by detecting the developed voltages of the first and second paths; and
developing the voltages of the first and second paths according to data stored in a second memory cell, which is different from the first memory cell, in a state where the first and second paths are not pre-charged,
wherein the sensing of the data stored in the first memory cell and the developing of the voltages of the first and second paths according to the data stored in the second memory cell are performed together while a level of a read clock is a first level, and the developing of the voltages of the first and second paths according to the data stored in the second memory cell is performed while the level of the read clock is a second level which is different from the first level.

10. The method of claim 9, wherein if the data stored in the first memory cell is identical to the data stored in the second memory cell, the voltages of the first and second paths remain unchanged.

11. The method of claim 9, wherein the developed voltages of the first and second paths are smaller than a first voltage, and the first voltage is smaller than a second voltage provided to the memory device.

12. The method of claim 9, wherein the sensing of the data stored in the first memory cell by detecting the developed voltages of the first and second paths comprises:
charging first and second capacitors with the developed voltages of the first and second paths, respectively; and
sensing the data stored in the first memory cell based on a difference between the voltage charged in the first capacitor and the voltage charged in the second capacitor.

13. The method of claim 9, wherein each of the first and second memory cells comprises an SRAM cell.

14. An electronic device, comprising:
a memory cell including a push pull circuit;
a sensing circuit connected to the memory cell to sense data stored in the memory cell by first and second paths which are separated from each other; and
a sample and hold circuit connected between the memory cell and the sensing circuit to sample data stored in the memory cell and to provide the sampled data to the sensing circuit; and a voltage regulator to down-regulate a voltage to a first voltage to which the push pull circuit is configured to develop one of the first and second paths according to data stored on the memory cell, the push pull circuit configured to develop the other of the first and second paths to ground, wherein the sensing of the data stored in the memory cell and the developing of the voltages of the first and second paths according to the data stored in the memory cell are performed together while a level of a read clock is a first level, and the developing of the voltages of the first and second paths according to the data stored in the memory cell is performed while the level of the read clock is a second level which is different from the first level.

15. A memory device including the electronic device of claim 14.

16. A system including a memory device of claim 15 and a controller.

17. The system of claim 16, further comprising a display, wherein the system is a wireless device.

* * * * *